United States Patent [19]

Schreiber et al.

[11] Patent Number: 5,443,911
[45] Date of Patent: Aug. 22, 1995

[54] CURABLE RESINS COMPRISING HALOGENATED EPOXY RESINS AND 1-OXA-3-AZA TETRALINE COMPOUNDS, METHOD FOR PREPARING AND USE OF RESINS

[75] Inventors: Herbert Schreiber, Wollerau; Günter Burkart, Rufi; Bruno Knaus, Wollerau, all of Switzerland

[73] Assignee: Gurit-Essex AG, Freienbach, Switzerland

[21] Appl. No.: 150,975

[22] Filed: Nov. 12, 1993

Related U.S. Application Data

[63] Continuation-in-part of Ser. No. 703,193, May 20, 1991, abandoned.

[30] Foreign Application Priority Data

May 21, 1990 [DE] Germany ............... 40 16 296.6

[51] Int. Cl.$^6$ .................. C08G 59/24; C08G 59/50
[52] U.S. Cl. .................. 428/413; 525/481; 525/484; 525/504; 528/96
[58] Field of Search .............. 528/96, 481, 484, 504; 428/413

[56] References Cited

U.S. PATENT DOCUMENTS

| | | | |
|---|---|---|---|
| Re. 32,745 | 9/1988 | Schreiber | 528/96 |
| 3,058,946 | 10/1962 | Nametz | 528/102 |
| 4,727,119 | 2/1988 | Berman et al. | 525/482 |
| 5,021,484 | 6/1991 | Schreiber et al. | 528/96 |

FOREIGN PATENT DOCUMENTS 356379  6/1989  European Pat. Off. .
579113  8/1976  Sweden .

OTHER PUBLICATIONS

Ullmann's Encyclopedia of Industrial Chemistry, 5th Edition, vol. A9.

*Primary Examiner*—Frederick Krass
*Attorney, Agent, or Firm*—Tarolli, Sundheim & Covell

[57] ABSTRACT

A curable resin comprising a mixture of (a) a component consisting of at least one thermally curable compound containing at least one 1-oxa-3-aza tetraline group, and (b) a component consisting of at least one curable brominated epoxy resin.

22 Claims, No Drawings

CURABLE RESINS COMPRISING HALOGENATED EPOXY RESINS AND 1-OXA-3-AZA TETRALINE COMPOUNDS, METHOD FOR PREPARING AND USE OF RESINS

This is a continuation-part of copending application Ser. No. 07/703,193 filed on May 20, 1991 now abandoned.

FIELD OF THE INVENTION

This invention refers to curable resins, to a method for preparing such cured resins, and to the use of such cured resins.

BACKGROUND OF THE INVENTION

There has been a long and steady demand for resins which may be cured to form polymeric resins which are difficultly inflammable or are both difficultly inflammable and resistant to high temperature.

In order to satisfy said demand, such cured resins should meet the classifications V0 or V1 according to "UL Specification 94 (Vertical Test)" (cf. Jü rgen Troitsch, "Brandverhalten von Kunststoffen" (1982 Munich/Vienna ISBN 3-446-13391-7), pages 396 to 399). As is generally known, the UL 94 Vertical Test is much severer than the UL 94 Horizontal Test. Thus, a resin classified in UL 94 HB does not meet classification UL 94 V0 or V1 (cf. Table 3 - Sample B).

Moreover, it is essential that the mechanical and electrical properties are not deteriorated by any additives, such as flame retardant additives. Furthermore, the halogen content, if any, of such resins should be as low as possible, since on combustion poisonous and corrosive smoke is developed. (cf. Jürgen Troitsch, "Flame Retardant Polymers Current Status and Future Trends", 4th Meeting of Fire Retardant Polymers, Freiburg i. Br. (Germany), 9 to 11 Sep. 1992).

From the publication U.S. Pat. No. 5,021,484 (Schreiber et al.) a resin is known which may be cured to form a polymeric resin which is difficultly inflammable and resistant to high temperatures, said resin being a mixture of:
(a) a resin component comprising at least one thermically curable 1-oxa-3-aza tetraline groups containing compound; and of
(b) a second component comprising at least one flame retardant selected form the group consisting of: aluminium hydroxide; hydrated calcium magnesium. carbonate; magnesium hydroxide; elemental red phosphorus; oxygen acids of phosphorous; in-organic salts of oxygen acids of phosphorous; organic salts of oxygen acids of phosphorous;.v polyphosphates; boric acid; and salts of boric acid; and optionally also contains at least one curable epoxy compound.

It is true that by curing said known resin, products which are difficultly inflammable (meeting classification V0 or V1 in the UL 94 Vertical Test) and resistant to high temperatures may be obtained. However, their properties are still not sufficient for many uses, since the mechanical and electrical properties are deteriorated by the flame retardant additive (b).

Furthermore, the publication U.S. Pat. No. 3,058,946 (Naemitz) discloses a plastic product comprising a cured mixture of a brominated polyepoxide and a non-halogenated epoxide. However, this plastic product does not meet tho above-mentioned requirements, inasmuch as it does not reach classification V0 or V1 in the UL 94 Vertical Test, as evidenced by the comparative tests de-scribed hereafter (cf. Table 3).

Furthermore, the publication U.S. Pat. No. 4,727,119 (Berman et al) discloses selected halogenated, including brominated, epoxy resins wherein the halogen atoms are in the meta position with respect to a glycidyl ether group attached-to an aromatic ring. Whereas some of these epoxy resins show a remarkable inflammation resistance, they nevertheless are unsuitable for most purposes, since they have a filler content of up to more than 233 phr (parts per hundred parts of resin). For this reason they are in particular unsuitable for preparing printed circuit boards or high strength composites.

SUMMARY OF THE INVENTION

It is a primary object of the present invention to eliminate the disadvantages of the prior art described above, and to provide novel curable resins which may be cured to form polymeric resins meeting the above-mentioned requirements.

It is a further object of the present invention to provide a method for preparing such cured polymeric resins.

It is a further object of the present invention to provide electric insulating materials, and in particular the basic material for printed circuit boards, which meet the above-mentioned requirements.

It is a still further object of the present invention to provide supporting structures, which meet the above-mentioned requirements.

According to the present invention, these and other objects are met by a curable resin comprising a mixture of:
(a) a component consisting of at least one thermically curable compound containing at least one 1-oxa-3-aza tetraline group;
(b) a component consisting of at least one curable brominated epoxy resin; optionally
(c) a component consisting of at least one curable non-brominated epoxy resin; and/or optionally
(d) a curing agent for epoxy resins.

PREFERRED EMBODIMENTS OF THE INVENTION

Compounds containing 1-oxa-3-aza tetraline groups and their prepolymers (hereafter jointly called "oxazene resins" by convenience) are known, for example from the publications CH-A5-574,978, CH-A5-579,113 and CH-A5-606,169.

The compounds containing 1-oxa-3-aza tetraline groups of component (a) are obtained, for example, from phenols by reaction with formaldehyde and an amine, approximately according to formula (A):

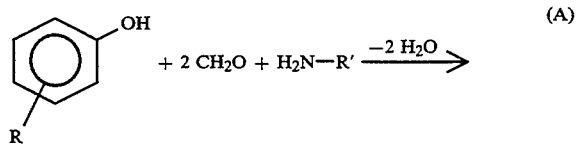

(A)

-continued

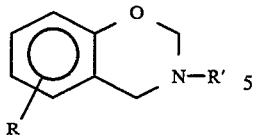

1-oxa-3-aza tetraline group.

For example, R is hydrogen, halogen, alkyl or alkoxy, and R' is an aliphatic or aromatic group.

However, the compounds containing 1-oxa-3-aza tetraline groups of component (a) can also be prepared by other methods resulting into similar products.

In contrast to other known condensation reactions of phenols, amines and formaldehyde, in the reaction outlined above phenolic OH-groups are consumed. It is thereby possible, according to the formula (A) hereinabove, to determine the amount of the synthesized 1-oxa-3-aza tetraline groups from the analytic determination of the said OH-groups in the reaction mixture.

Prepolymers of 1-oxa-3-aza tetraline groups containing compounds are also useful for preparing said oxazene resins. Since some of the 1-oxa-3-aza tetraline groups may react during polymerization, these prepolymers may contain a smaller number of said 1-oxa-3-aza tetraline groups than provided by the monomers used to form such prepolymers. However, it is essential that the intermediately formed or hypothetic monomer reaction product does in fact contain 1-oxa-3-aza tetraline groups. This can easily be calculated by a person skilled in the art from the functionality. An 1-oxa-3-aza tetraline compound, or its prepolymer, useful in accordance with the present invention for example, formed if the molar ratio is kept within the limits defined in the above-mentioned publication CH-A5-606,169.

Phenol or phenol derivatives as well as amines and formaldehyde are used as starting or basic materials for preparing the oxazene resin.

Preferably, for the present invention, 1-oxa-3-aza tetraline groups containing compounds are used which are formally derived from a phenol and an amine, one of said components being more than monofunctional.

Examples of phenols which can be used are:
Monovalent phenols, such as phenol, m- and p-cresol, m- and p-ethyl phenol, m- and p-isopropyl phenol, m- and p-isopropyloxy phenol, m- and p-chloro phenol, and beta-naphthol. Para- and meta-substituted phenols are preferred, since they do not include any blocked reactive positions. Also preferred are the phenols which are not alkyl substituted and not alkyloxy substituted, respectively.
Bivalent phenols, such as 4,4'-dihydroxydiphenyl methane, 3,3'-dihydroxydiphenyl methane, 2,2'-bis-(4-hydroxyphenyl) propane, 4,4'-dihydroxy stilbene, hydroquinone, and resorcin.
Low-condensed phenolic formaldehyde novolak resins, eventually mixed with a phenol.
Examples of amines which are particularly useful are:
Aniline, phenylene diamine, benzidine, diaminodiphenyl methane, 2,2'-bis-(aminophenyl) propane, cyclohexylamine, ethylenediamine and propylenediamine, in particular p-phenylenediamine and 4,4'-diaminodiphenyl methane, aromatic amines being preferred.

Also particularly useful are 1-oxa-3-aza tetraline compounds which are derived from a novolak and an aromatic amine, preferably from a novolak having a degree of polymerization of about 2 and of aniline, or from phenol and an aromatic diamine.

Preferably, the second component (b) comprises or consists of:
one or several glycidyl ethers of brominated phenols, in particular polyvalent phenols;
one or several glycidyl ethers of condensation products of brominated phenols with aldehydes or ketones; or
one or several glycidyl ethers of brominated novolaks.

Particularly useful are the glycidyl ethers of brominated bisphenol A or of brominated bisphenol F, in particular tetrabromo bisphenol A or tetrabromo bisphenol F, as well as brominated novolaks.

Brominated epoxy resins are known and commercially available. Examples of suitable resins:

Product No. 1
(Trade Name: "D.E.R. 511-A 80" of The Dow Chemical Company): Brominated epoxy resin of the bisphenol-A type in an acetone solution.

| | | |
|---|---|---|
| Epoxide equivalent weight[1]: | 445 ... 520 | |
| Viscosity (25° C.): | 1000 ... 4000 | mPa·s |
| Non-volatiles: | 80 ± 1 | percent by weight |
| Solvent: | Acetone | |
| Color according to Gardner, maximum: | 5 | |
| Bromine content[1]: | 19 ... 21 | percent by weight |
| Flash point (T.O.C.): | 63° C. | |

Product No. 2
(Trade Name: "D.E.R. 511-EK 80" of The Dow Chemical Company): Brominated epoxy resin of the bisphenol-A type in a methyl ethyl ketone solution.

| | | |
|---|---|---|
| Epoxide equivalent weight[1]: | 445 ... 522 | |
| Viscosity (25° C.): | 1000 ... 4000 | mPa·s |
| Non-volatiles: | 80 ± 1 | percent by weight |
| Solvent: | Methyl ethyl ketone | |
| Color according to Gardner, maximum: | 9 | |
| Bromine content[1]: | 19 ... 21 | percent by weight |
| Flash Point (T.O.C.): | 52° C. | |

Product No. 3
(Trade Name: "D.E.R. 512-A 80" of The Dow Chemical Company): Brominated epoxy resin of the bisphenol-A type in an acetone solution.

| | | |
|---|---|---|
| Epoxide equivalent weight[1]: | 480 ... 560 | |
| Viscosity (25° C.): | 700 ... 2500 | mPa·s |
| Non-volatiles: | 80 ± 1 | percent by weight |
| Solvent: | Acetone | |
| Color according to Gardner, maximum: | 5 | |
| Bromine content[1]: | 21 ... 22,5 | percent by weight |
| Flash point (T.O.C.): | 56° C. | |

Product No. 4
(Trade Name: "D.E.R. 512-EK 75" of The Dow Chemical Company): Brominated epoxy resin of the bisphenol-A type in a methyl ethyl ketone solution.

| | | |
|---|---|---|
| Epoxide equivalent weight[1]: | 480 ... 560 | |
| Viscosity (25° C.): | 500 ... 1500 | mPa·s |
| Non-volatiles: | 75 ± 1 | percent by weight |
| Solvent: | Methyl ethyl ketone | |
| Color according to Gardner, maximum: | 3 | |
| Bromine content[1]: | 21 ... 22,5 | percent by weight |
| Flash point (T.O.C.): | <−2° C. | |

Product No. 5
(Trade Name: "D.E.R. 512-EK 80" of The Dow Chemical Company): Brominated epoxy resin of the bisphenol-A type in a methyl ethyl ketone solution.

| | | |
|---|---|---|
| Epoxide equivalent weight[1]: | 480 ... 560 | |
| Viscosity (25° C.): | 1000 ... 3500 | mPa·s |
| Non-volatiles: | 80 ± 1 | percent by weight |
| Solvent: | Methyl ethyl ketone | |

-continued

| | |
|---|---|
| Color according to Gardner, maximum: | 5 |
| Bromine content | 21 ... 22,5 percent by weight |
| Flash point (T.O.C.): | 52° C. |

Product No. 6
(Trade Name: "D.E.R. 521-A 80" of The Dow Chemical Company): Brominated epoxy resin of the bisphenol-A type in an acetone solution.

| | |
|---|---|
| Epoxide equivalent weight[1]: | 430 ... 475 |
| Viscosity (25° C.): | 1000 ... 4500 mPa·s |
| Non-volatiles: | 80 ± 1 percent by weight |
| Solvent: | Acetone |
| Color according to Gardner, maximum: | 6 |
| Bromine content[1]: | 19 ... 22 percent by weight |
| Flash point (T.O.C.): | 63° C. |

Product No. 7
(Trade Name: "D.E.R. 542" of The Dow Chemical Company): Bromindted epoxy resin of the bisphenol-A type.

| | |
|---|---|
| Epoxide equivalent weight[1]: | 305 ... 355 |
| Softening point according to Durran: | 50,5 ... 62,5° C. |
| Bromine content: | 44 ... 49 percent by weight |
| Flash point (T.O.C.): | 199° C. |

Product No. 8
(Trade Name: "D.E.R. 566-A 80" of The Dow Chemical Company): Brominated epoxy resin of the bisphenol-A type in an acetone solution.

| | |
|---|---|
| Epoxide equivalent weight[1]: | 410 ... 450 |
| Viscosity (25° C.): | 800 ... 4000 mPa·s |
| Non-volatiles: | 80 ± 1 percent by weight |
| Solvent: | Acetone |
| Color according to Gardner, maximum: | 5 |
| Bromine content[1]: | 18 ... 20 percent by weight |
| Flash Point (T.O.C.): | <2° C. |

Product No. 9
(Trade Name: "QUATREX 6410" of The Dow Chemical Company): Brominated epoxy resin of the bisphenol-A type.

| | |
|---|---|
| Epoxide equivalent weight[1]: | 450 |
| Softening point: | 80° C. |
| Viscosity (150° C.): | 0,0180 m$^2$·s$^{-1}$ |
| Hydrolyzable chloride: | <150 ppm |
| Volatiles: | <0,25 percent by weight |
| Bromine content: | 47 ... 51 percent by weight |
| Glass transition temperature after phenolic curing: | 175° C. |

[1]Based on the solids content

Brominated epoxy resins were already proposed as sole components and in combination with curing agents for preparing difficultly inflammable polymeric resins. However, said polymeric resins show the following essential drawbacks:
They have glass transition temperatures which are too low.
In the case of combustion, they produce considerable quantities of the highly toxic carbonyldibromide, due to their high bromine content.

According to the present invention, the bromine content is preferably less than 1.5 gram equivalents, in particular less than 1 equivalent, based on one kilogram to the total weight of the above-mentioned components (a) to (d).

Consequently, the bromine content is preferably less than 12 percent by weight, in particular less than 8 percent by weight, based on the total weight of the resin. Even with bromine contents as low as 5, 2.5, and 1 percent by weight, respectively, flame resistant resins can be obtained.

Preferably, the quantity of component (b) is less than 30 percent by weight, based on the total weight of the resin (component (a) + component (b)). However, flame resistant resins are already obtained with quantities of less than 15 percent by weight, or of less than 5 percent by weight, or even of less than 2 percent by weight of component (b), based on the total weight of the resin.

The fact that the advantages described hereafter may be obtained with such small quantities of a brominated epoxy resin was highly surprising to a person skilled in the art.

It is a particular advantage that—beside an essentially improved thermic behavior in combination with excellent electrical properties which will be explained hereafter in detail—in the case of combustion they produce only small quantities of toxic compounds, and that only a small quantity of the expensive component (b) must be used.

The mixture according to the invention may also comprise a component (c) comprising or consisting of at least one non-brominated epoxy resin. Advantageously, the quantity of said component (c) is less than the quantity of component (b), and preferably less than half the quantity of component (b).

Such suitable epoxy resins are in particular monofunctional or multifunctional epoxy compounds which can be cured thermically, catalyticly or by means of a curing agent.

The mixture according to the invention may also comprise as component (d) a curing agent for epoxy resins. Polyvalent amines, polyvalent carboxylic acids and their anhydrides, dicyano diamide, as well as novolaks are particularly useful as such curing agents.

Suitable epoxy compounds and curing agent are, for example, described in:
Sidney H. Goodman, Handbook of Thermoset Plastics, Noyes Publications, Park Ridge, NJ;
W. G. Potter, Epoxide Resins, Ilife Books, London;
Henry Lee and Kris Neville, Handbook of Epoxy Resins, McGraw-Hill Book Company, New York/San Francisco/Toronto/London.

By thermically curing the above-mentioned curable resins at a temperature of above 100° C., in particular at a temperature of 140° to 220° C., polymeric resins which are difficultly inflammable, resistant to high temperatures and heat resistant can be obtained.

Surprisingly, the properties of the polymeric resins cured as explained above can still be considerably improved by a thermic aftertreatment. Thus, for example, by tempering them for 24 hours at a temperature of 220° C., the glass transition temperature rises up to more than 280° C.

Advantageously, the cured polymeric resins are subject to said thermic aftertreatment at a temperature of 180° to 250° C., and preferably at a temperature of 200° to 230° C. The duration of said tempering depends on the temperature. The following standard values may serve as a basis: however, the durations can be extended at will without deterioration of the polymeric resins:
Curing:
4 hours at 180° C.; or
2 hours at 200° C.
Tempering:
24 hours at 220° C.
Also, these durations can be proportionally combined at will. For example, the following tempering cycle-has proved its value:

30 minutes/200° C.+30 minutes/220° C.+30 minutes/230° C.+30 minutes/250° C.

The properties of the polymeric resins produced as described above can be tailored for certain applications by addition of usual additives. The following additives are of particular importance:

- reinforcement fibers, such as glass, quartz, carbon, mineral and synthetic fibers, in the usual forms of short fibers, staple fibers, threads, fabrics or mats;
- plasticizers, especially phosphorous compounds;
- carbon black or graphite;
- fillers;
- dyestuffs;
- micro hollow spheres;
- metal powder;
- catalysts; and flame retardants, in particular the following groups of compounds, and compounds, respectively:
- aluminium hydroxide;
- hydrated calcium magnesium carbonate;
- magnesium hydroxide;
- elemental red phosphorous;
- oxygen acids of phosphorous
- inorganic salts of oxygen acids of phosphorous;
- organic salts of oxygen acids of phosphorous;
- polyphosphates;
- boric acid;
- salts of boric acids.

The methods known for processing thermically curable phenol formaldehyde resins or EP resins, such as hot-pressing of prepregs, SMC (Sheet Molding Compound); or molding of molding compounds, casting, filament winding, vacuum impregnating, may be used for processing the resins according to the invention.

The polymeric resins which can be obtained by curing, or by curing followed by tempering the resins according to the invention, and which are difficultly inflammable and resistant to high temperatures, are particularly suitable for the following uses:
- as electric insulating materials, in particular for printed circuit boards;
- for supporting structures, in particular in aircraft constructions;
- wherever resins which are flame-resistant or resistant to high temperatures are to be used;
- as adhesives.

EXAMPLES

1. Starting materials

The following starting materials are used in the following examples:

Component (a):

(A/I) Oxazene resin 1
Reaction product of phenol with aniline and formaldehyde in a molar ratio of 1:1:2, having the structural formula:

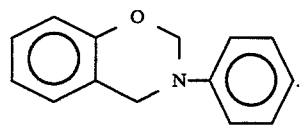

(A/2) Oxazene resin 2
Reaction product of 1 mole (2 equivalents) of the novolak obtained by reacting 2 moles of phenol and 1 mole of formaldehyde, with 2 moles of aniline and with 4 moles of formaldehyde, having the the following average composition:

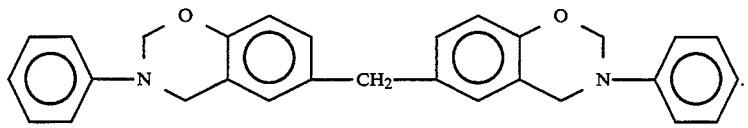

(A/3) Oxazene resin 3
Reaction product of 4,4'-diamino-diphenylmethane with phenol and formaldehyde in a molar ratio of 1:2:4, having the structural formula:

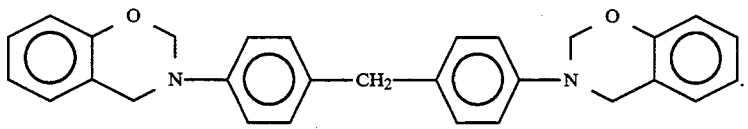

Component (b)

(B/1) Brominated epoxy resin 1 (above-mentioned Product No. 7) "D. E. R 542" of The Dow Chemical Company Bromine content, based on solids: 44 ... 49 percent by weight (B/2) Brominated epoxy resin 2 (above-mentioned Product No. 9)
"Quatrex 6410" of The Dow Chemical Company Bromine content, based on solids: 47 ... 51 percent by weight Reinforcing material
(R) Glass cloth
"Type 90085" of Interglas-Textil OmbH
Surface density: 108 g/m$^2$
Number of threads/cm: 24×24
Epoxy silane finish 2. Preparation of samples The components specified in Table 1 were mixed under reduced pressure at 100 bis 130° C. Then, the samples for the thermal analysis were withdrawn and cured. The remainder was soaked up, with or without glass cloth, between teflonized glass plates and cured in an circulating air oven for 2 hours at 200° C.

3. Flame-resistance test

The flame-resistance test was made according to UL Specification 94 (Vertical Test), abbreviated: "UL 94" (cf.: Jü rgen Troitzsch, Brandverhalten yon Kunststoffen (1982 Munich/Vienna ISBN 3-446-13991-7), pages 396 to 399).

The results are compiled in Table 1.

It was surprising that Class UL-94-V0 can already be obtained by a content of 5 to 10 percent by weight of bromine, for glass cloth reinforced samples already by a content of 5 percent by weight of bromine.

4. Mechanical properties

The mechanical properties and the glass transition temperature Tg (also called "glass temperature") were determined, with or without tempering, by means of
DCS ("Differential Scanning Calorimetry"),
DMA ("Differential Mechanical Analysis"), and
TMA ("Thermo Mechanical Analysis").
The results are compiled in Table 2.

It was extremely surprising that the rise in the glass transition temperature obtainable by a tempering is associated with an essentially reduced drop of the E' module at a temperature of 180° C. (cf. in particular: Sample 4).

TABLE 1

| Sample No. | Composition | | | | | Glass R Layers | Thickness mm | Flame resistance UL 94 | | | | |
|---|---|---|---|---|---|---|---|---|---|---|---|---|
| | Component (a) | | | Component (b) | | | | Duration of Combustion Ignition | | | | |
| | A/1 | A/2 | A/3 | B/1 | B/2 | | | #1 s | #2 s | Class | % Br | g eq/kg |
| | Parts by weight | | | | | | | | | | | |
| 1 | | | 90 | 10 | | | 0.80 | 4.0 | 4.8 | V1 | 5 | 0.62 |
| 2 | | | 90 | 10 | | 9 | 0.92 | 2.8 | 3.0 | V0 | 5 | 0.62 |
| 3 | | | 80 | 20 | | | 0.80 | 1.7 | 0.7 | V0 | 10 | 1.25 |
| 4 | | | 80 | 20 | | 9 | 0.90 | 1.5 | 0.5 | V0 | 10 | 1.25 |
| 5 | | | 90 | | 10 | | 1.00 | 0.0 | 2.0 | V0 | 5 | 0.62 |
| 6 | | | 85 | | 15 | | 1.03 | 0.0 | 0.3 | V0 | 7.5 | 0.94 |
| 7 | | | 80 | | 20 | | 1.05 | 0.0 | 0.0 | V0 | 10 | 1.25 |
| 8 | | 90 | | | 10 | | 1.07 | 11.7 | 14 | V1 | 5 | 0.62 |
| 9 | | 85 | | | 15 | | 1.03 | 6.7 | 7.3 | V1 | 7.5 | 0.94 |
| 10 | | 80 | | | 20 | | 1.04 | 1.7 | 3.7 | V0 | 10 | 1.25 |
| 11 | | | 95 | | 5 | 9 | 1.04 | 10 | 3 | V1 | 2.5 | 0.31 |
| 12 | | | 97.5 | | 2.5 | 9 | 1.02 | 13 | 10 | V1 | 1.25 | 0.16 |
| 13 | | | 99 | | 1 | 9 | 1.02 | 38 | 10 | V1 | 0.5 | 0.12 |
| 14 | 80 | | | 20 | | | 1.00 | 3 | 2 | V0 | 10 | 1.25 |

TABLE 2

| Sample No. | Curing/ Tempering h/°C. | Mechanical properties | | | DMA 1), 2) | | TMA 3) | DCS 4) |
|---|---|---|---|---|---|---|---|---|
| | | Strength | | | | | | |
| | | Bending Strength N/mm$^2$ | E Module N/mm$^2$ | Thickness mm | $E'_{80°}$ GPa | $E'_{180°}$ GPa | Tg °C. | Tg °C. |
| 1 | 2/200 | | | | 4.8 | 1.2 | 182 | 171 |
| 2 | 2/200 | 522 ± 14 | 23.500 | 0.91 | 2.7 | 2.4 | | |
| 3 | 2/200 | 118 ± 5 | 11.800 | 0.85 | 5.8 | | 178 | |
| | +24/220 | 103 ± 21 | 14.800 | | 5.7 | 4.9 | | |
| | +72/220 | 112 ± 29 | 14.400 | | 5.4 | 4.7 | | |
| 4 | 2/200 | 495 ± 14 | 22.300 | 0.91 | 3.0 | 1.6 | 178 | |
| | +2/220 | | | | 4.4 | 4.0 | | |
| | +24/220 | | | | 8.5 | 8.2 | 280 | |
| 5 | | | | | | | | 181 |
| 6 | | | | | | | | 179 |
| 7 | | | | | | | | 184 |
| 8 | | | | | | | | 162 |
| 9 | | | | | | | | 158 |
| 10 | | | | | | | | 156 |

Remarks
1)"Differential Mechanical Analysis"
2)Only 1 layer of glass fibers d = 0.11 to 0.2 mm
3)"Thermo Mechanical Analysis"
4)"Differential Scanning Calorimetry"

TABLE 3

| Sample | Composition of sample - Flame-resistance test according to UL 94 | | | | | | | |
|---|---|---|---|---|---|---|---|---|
| | Composition | Glass R Layers | Thickness mm | UL 94 (horizontal) | | UL 94 (vertical) | | |
| | | | | Duration of Combustion s | Class | Duration of Combustion | | Class |
| | See below Parts by weight | | | | | Total s | Maximum s | |
| A | 100 A/3 | 9 | 1.02 | Burns up to the top | | | | |
| B | 20 parts A/3 10 parts "Araldite CY 179"1) 5 parts Al(OH)$_3$ | 12 | 1.05 | 2 to 8 | HB | 360 | 33 | Not classifiable |
| C | Example 4 of US-A-3,058,946 | None | | | | | | |
| | 5% Bromine | | 1.6 | 30 to 57 | HB | | | |
| | 10% Bromine | | 1.6 | 10 to 12 | HB | | | |
| | 20% Bromine | | 1.6 | 7 to 10 | HB | | | |

Remarks:
1)Of Ciba-Geigy AG, Switzerland

We claim:
1. A curable resin mixture comprising:

a) a resin component consisting of at least one compound containing at least one thermically curable 1-oxa-3-aza tetraline group; and b) a resin component consisting of at least one curable brominated epoxy resin;

the bromine content being in the range of 0.5 to 12 percent by weight based on the total weight of said resin components (a) and (b);

wherein a composition consisting of components (a) and (b) when cured forms a polymeric resin having a flame resistance of class V0 or VI in the UL 94 Vertical Test.

2. A resin mixture according to claim 1, wherein said bromine content is in the range of 0.5 to 5 percent by weight based on the total weight of said resin components (a)+(b).

3. A resin mixture according to claim 2, wherein said bromine content is in the range of 0.5 to 2.5 percent by weight based on the total weight of said resin components (a)+(b).

4. A resin mixture according to claim 1, wherein said 1-oxa-3-aza tetraline group containing compound of component (a) is derived from a phenolic compound, formaldehyde and an amine.

5. A resin mixture according to claim 4, wherein said amine is an aromatic amine.

6. A resin mixture according to claim 5, wherein said aromatic amine is 4,4'-diamino-diphenyl-methane.

7. A resin mixture according to claim 1, wherein said 1-oxa-3-aza tetraline group containing compound of component (a) is derived from a aldehyde, a phenol compound and an amine, one of the phenolic compound or the amine being more than mono-functional.

8. A resin mixture according to claim 1, wherein said 1-oxa-3-aza tetraline group containing compound of component (a) is derived from a novolak.

9. A resin mixture according to claim 8, wherein said 1-oxa-3-aza tetraline group containing component (a) is derived from a novolak having a degree of polymerization of 1.5 to 3.

10. A resin mixture according to claim 1, wherein said component (b) comprises at least one glycidyl ether of a brominated phenol.

11. A resin mixture according to claim 1, wherein said component (b) comprises at least one glycidyl ether of the condensation product of a brominated phenol with a compound selected from the group consisting of aldehydes and ketones.

12. A method for preparing polymeric resins which have resistance to flammability wherein the resin mixture according to claim 1 is cured.

13. A method according to claim 12, wherein said resin mixture is cured in non-reinforced form.

14. A method according to claim 12, wherein said resin mixture is cured in reinforced form.

15. A method according to claim 12, wherein said resin mixture is cured at a temperature of above 100° C.

16. A method according to claim 12, wherein said polymeric resins are tempered after curing raising their glass transition temperature.

17. A method according to claim 16, wherein said polymeric resins are tempered at a temperature of 180° to 250° C.

18. An electric insulating material comprising a cured polymeric resin having the composition according to claim 1.

19. An electric insulating material according to claim 18, further comprising at least one reinforcing means.

20. A supporting structure comprising a polymeric resin cured according to claim 1 and at least one reinforcing means.

21. A curable adhesive comprising a resin mixture according to claim 1.

22. A resin mixture according to claim 1 further comprising a curing agent for an epoxy resin.

* * * * *